United States Patent
Thomas

(10) Patent No.: US 12,388,460 B2
(45) Date of Patent: Aug. 12, 2025

(54) SUBRANGING ADC BUFFER CASCADE

(71) Applicant: Analog Devices, Inc., Wilmington, MA (US)

(72) Inventor: Andrew Joseph Thomas, Arlington, MA (US)

(73) Assignee: Analog Devices, Inc., Wilmington, MA (US)

( * ) Notice: Subject to any disclaimer, the term of this patent is extended or adjusted under 35 U.S.C. 154(b) by 22 days.

(21) Appl. No.: 18/206,550

(22) Filed: Jun. 6, 2023

(65) Prior Publication Data

US 2023/0353164 A1     Nov. 2, 2023

Related U.S. Application Data

(63) Continuation-in-part of application No. 17/653,614, filed on Mar. 4, 2022, now Pat. No. 11,711,073.

(51) Int. Cl.
     *H03M 1/46*      (2006.01)
     *H03M 1/06*      (2006.01)

(52) U.S. Cl.
     CPC .......... *H03M 1/46* (2013.01); *H03M 1/0614* (2013.01)

(58) Field of Classification Search
     CPC .... H03M 1/46; H03M 1/0614; H03M 1/0641; H03M 1/164; H03M 1/124
     See application file for complete search history.

(56) References Cited

U.S. PATENT DOCUMENTS

| | | |
|---|---|---|
| 6,084,440 A | 7/2000 | Sousa |
| 6,696,869 B1 | 2/2004 | Tan |
| 7,385,426 B1 | 6/2008 | Wan et al. |
| 7,804,328 B2 | 9/2010 | Pentakota et al. |
| 8,390,491 B2 | 3/2013 | Wakimoto |
| 8,749,276 B2 | 6/2014 | Nakazawa |
| 9,219,490 B1 | 12/2015 | Pereira et al. |
| 9,258,006 B2 | 2/2016 | Oshima et al. |
| 9,407,276 B1 | 8/2016 | Coban et al. |
| 9,595,974 B1 * | 3/2017 | Pereira .................. H03M 1/164 |
| 10,020,068 B2 | 7/2018 | Hurrell et al. |
| 10,910,843 B2 | 2/2021 | Kinzer et al. |
| 11,095,254 B1 | 8/2021 | Sousa |
| 2009/0051455 A1 | 2/2009 | Miyashita |
| 2010/0060496 A1 * | 3/2010 | Madisetti ............ H03M 1/0624 341/118 |
| 2021/0021277 A1 * | 1/2021 | Shifman .................. H04B 1/16 |

FOREIGN PATENT DOCUMENTS

KR      101094397 B1     12/2011

OTHER PUBLICATIONS

"U.S. Appl. No. 17/653,614, Non Final Office Action mailed Nov. 7, 2022", 8 pgs.
"U.S. Appl. No. 17/653,614, Notice of Allowance mailed Mar. 6, 2023", 7 pgs.
"U.S. Appl. No. 17/653,614, Response filed Feb. 7, 2023 to Non Final Office Action mailed Nov. 7, 2022", 7 pgs.

* cited by examiner

*Primary Examiner* — Metasebia T Retebo
(74) *Attorney, Agent, or Firm* — Schwegman Lundberg & Woessner, P.A.

(57) ABSTRACT

An analog-to-digital converter (ADC) system, such as a subranging ADC, including a cascade of buffer circuits and signal processing circuitry to measure and cancel the distortion introduced by the buffer circuits. Thus, buffer circuits can be added to the signal path of an input signal without the detrimental effects, such as added distortion, that typically accompany the addition of buffers.

20 Claims, 6 Drawing Sheets

SUBRANGING ADC BUFFER CASCADE

CLAIMS OF PRIORITY

This patent application is a continuation-in-part of U.S. patent application Ser. No. 17/653,614, titled "BUFFER CASCADE," filed on Mar. 4, 2022, which is hereby incorporated by reference herein in its entirety.

TECHNICAL FIELD

The present disclosure generally relates to perturbation or distortion mitigation techniques in analog circuits, in particular signal conditioning circuits such as buffers.

BACKGROUND

In designing circuitry that processes analog signals, analog circuit elements are oftentimes inserted in the path of an input signal to provide some signal conditioning. However, the additional circuit elements can introduce detrimental effects, such as distortion, which can have a negative impact. One approach to reduce these detrimental effects is by optimizing the design of the additional circuit elements themselves. But to obtain a high level of accuracy, this could mean undesirable tradeoffs in circuit complexity, area, power, and other functional aspects.

BRIEF DESCRIPTION OF THE DRAWINGS

Various ones of the appended drawings merely illustrate examples of the present disclosure and should not be considered as limiting its scope.

DETAILED DESCRIPTION

The present disclosure provides designs and techniques to reduce detrimental effects of analog circuit elements without the use of complex, expensive circuits. The techniques described herein provide a cascade of buffer circuits and signal processing circuitry to measure and cancel the distortion introduced by the buffer circuits themselves. Thus, a buffer can be added to the signal path of an input signal without the detrimental effects, such as added distortion, that typically accompany the addition of buffers.

This document describes an apparatus to reduce distortion in an input signal. The apparatus includes a first buffer to receive the input signal and to generate a first buffer output signal; a second buffer to receive the first buffer output signal and to generate a second buffer output signal; and a signal processing circuit to generate a corrected input signal based on the first buffer output signal and the second buffer output signal.

This document also describes method to reduce distortion in an input signal. The method includes buffering the input signal to generate a first buffer output signal; buffering the first buffer output signal to generate a second buffer output signal; and generating a corrected input signal based on the first buffer output signal and the second buffer output signal.

This document further describes a signal conditioning circuit to reduce distortions. The circuit includes a first buffer including a first source follower transistor to receive the input signal and to generate a first buffer output signal; a second buffer including a second source follower transistor to receive the first buffer output signal and to generate a second buffer output signal; and a signal processing circuit to generate a corrected input signal based on the first buffer output signal and the second buffer output signal.

Figure 1:
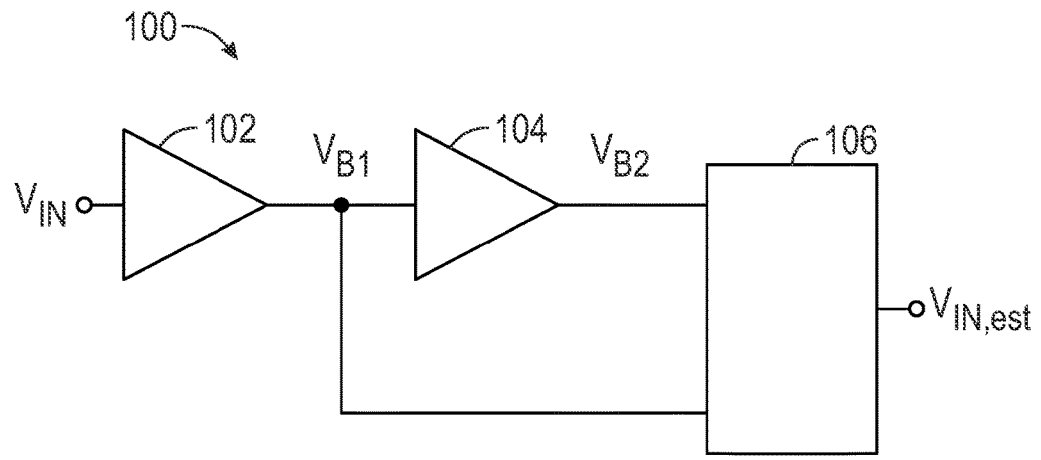
FIG. 1 illustrates a block diagram of example portions of a signal conditioning circuit.

Oftentimes, an input signal cannot be coupled directly to other circuits, such as an analog to digital converter, an amplifier, etc. Buffers can be inserted in the signal path to buffer the input signal before coupling to the other circuits. FIG. 1 illustrates a block diagram of example portions of a signal conditioning circuit 100. The signal conditioning circuit 100 may include a first buffer 102, a second buffer 104, and a processing circuit 106. The first buffer 102 and second buffer 104 may have substantially similar circuit properties, as described in further detail below. An input signal $V_{IN}$ may be provided to an input of the first buffer 102. The input signal is an analog signal and can be provided as an AC or DC signal. The first buffer 102 may buffer the input signal $V_{IN}$ and generate a first buffer output signal $V_{B1}$.

The output of the first buffer 102 may be coupled to the second buffer 104 and the processing circuit 106. The second buffer 104 may buffer $V_{B1}$ and generate a second buffer output signal $V_{B2}$. The output of the second buffer 104 may also be coupled to the processing circuit 106.

The processing circuit 106 may receive $V_{B1}$ and $V_{B2}$ as inputs. The processing circuit 106 may be provided as an analog circuit, a digital circuit, and/or a combination thereof, as described in further detail below. As mentioned above, the buffers 102, 104 may add some perturbation or distortion to the input signal. The processing circuit 106 may measure the perturbation or distortion introduced by each of the buffers 102, 104 and may then cancel the measured distortions to generate a corrected input signal $V_{IN\_est}$. Thus, the corrected input signal $V_{IN\_est}$ may be extrapolated from $V_{B1}$ and $V_{B2}$, and $V_{IN\_est}$ may represent the true input signal $V_{IN}$ without (or reduced) distortion or perturbation added by the buffer circuits.

The first buffer 102 may inject a first error component into the input signal: $V_{err1}$. Likewise, the second buffer 104 may inject a second error component: $V_{err2}$. The processing circuit 106 may implement a function to subtract the second error component $V_{err2}$ from the first error component $V_{err1}$. For example, the processing circuit 106 may execute the following function:

$$V_{IN,est} = 2V_{B1} - V_{B2}$$

This function can be represented by replacing $V_{B1}$ and $V_{B2}$ with their inputs and error components:

$$V_{IN,est} = 2V_{B1} - V_{B2} = 2(V_{IN} + V_{err1}) - (V_{B1} + V_{err2}) =$$
$$2(V_{IN} + V_{err1}) - (V_{IN} + V_{err1} + V_{err2}) = V_{IN} + (V_{err1} - V_{err2})$$

Hence, the corrected input signal $V_{IN\_est}$ may represent the input signal $V_{IN}$ plus the difference of the error components introduced by the buffers 102, 104. If the perturbation of the second buffer 104 substantially replicates the perturbation of the first buffer 102 ($V_{err1} \approx V_{err2}$), the corrected input signal $V_{IN\_est}$ will provide an accurate approximation of the input signal $V_{IN}$.

Figure 2:
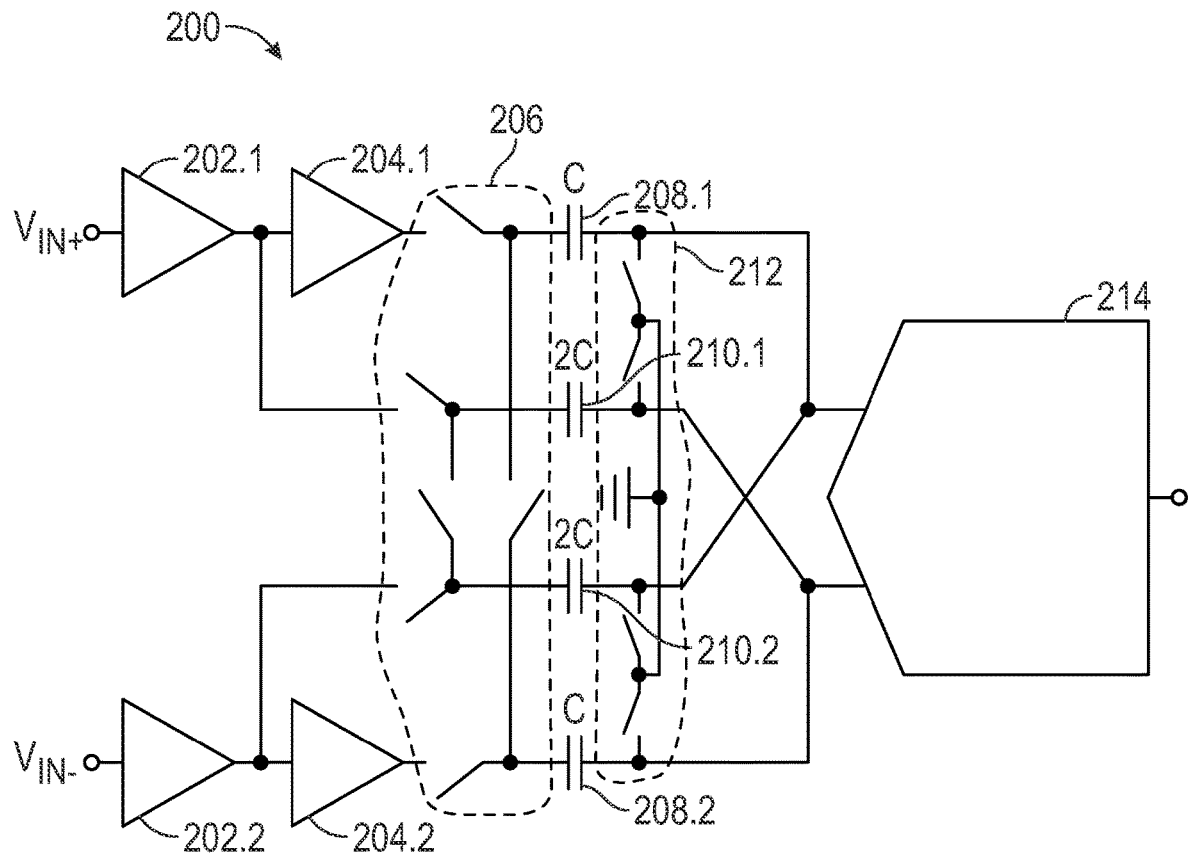
FIG. 2 illustrates a circuit diagram of example portions of a signal conditioning circuit.

The signal processing functionality can be implemented using analog circuitry, digital circuitry, and/or a combination thereof. FIG. 2 illustrates a circuit diagram of example portions of a signal conditioning circuit 200. The signal conditioning circuit 200 implements the signal processing functionality in the analog domain using a charge-subtraction technique. The signal conditioning circuit 200 is illustrated as differential implementation, where the input signal is represented by $V_{IN+}$ and $V_{IN-}$. The signal conditioning circuit 200 may include a first buffer 202.1, 202.2; a second buffer 204.1, 204.2; a first set of switches 206; a first set of capacitors C 208.1, 208.2; a second set of capacitors 2C 210.1, 210.2; a second set of switches 212; and an analog-to-digital converter (ADC) 214.

The first buffer 202.1, 202.2 and second buffer 204.1, 204.2 may operate in the same manner as buffers 102, 104 described above with reference to FIG. 1. The output of the first buffer 202.1, 202.2 ($V_{B1+}$, $V_{B1-}$) may be coupled to second buffer 204.1, 204.2 and to the second set of capacitors 2C 110.1, 110.2 via switches 206.

The output of the second buffer 204.1, 204.2 ($V_{B2+}$, $V_{B2-}$) may be coupled the first set of capacitors C 208.1, 208.2 via switches 206. In operation, first and second set of switches 206, 212 are controlled such that during an acquisition cycle switches 212 are closed coupling the right plates of the capacitors 208, 210 to ground. During sampling, switches 212 may be opened and switches 206 may also be opened such that corresponding charge gets stored on the first and second set of capacitors 208, 210. Capacitors 2C 210.1, 210.2 store double the charge corresponding to $V_{B1}$ (i.e., 2 $V_{B1}$) and capacitors C 208.1, 210.2 store the charge corresponding to $V_{B2}$. Hence, the cross connection to the ADC 214 executes the charge-subtraction ($2V_{B1}-V_{B2}$). The output of the ADC 214 is the digital version of the corrected input signal $V_{IN\_est}$.

Figure 3:
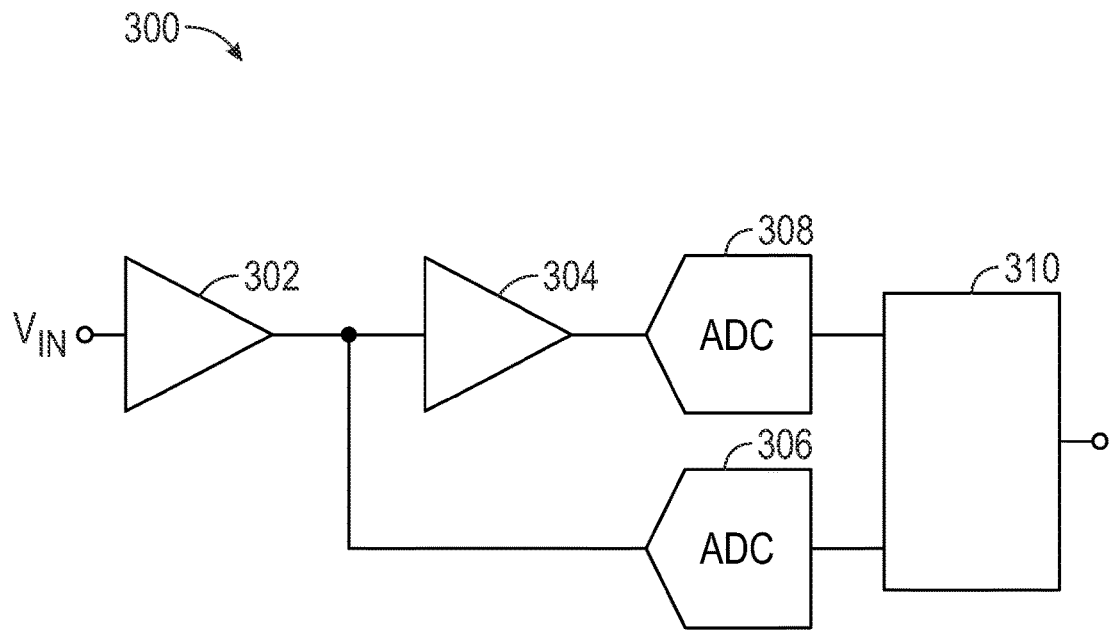
FIG. 3 illustrates a block diagram of example portions of a signal conditioning circuit.

FIG. 3 illustrates a block diagram of example portions of a signal conditioning circuit 300. The signal conditioning circuit 300 implements the signal processing functionality in the digital domain by converting the individual buffer outputs to digital signals and then using digital signal processing to remove the error components. The signal conditioning circuit 300 may include a first buffer 302, a second buffer 304, a first ADC 306, a second ADC 308, and a digital signal processor 310.

The first buffer 302 and second buffer 304 may operate in the same manner as buffers 102, 104 described above with reference to FIG. 1. The output of the first buffer 302 ($V_{B1}$) may be digitized by ADC 306, and the output of the second buffer 304 ($V_{B2}$) may be digitized by ADC 308. The digital signal processor 310 may then execute functions (e.g., $2V_{B1}-V_{B2}$) to remove distortion or perturbation effects of the buffers.

The ADCs 306, 308 may be provided as successive approximation register (SAR) ADCs or other suitable types of ADCs. The ADCs 306, 308 may be synchronized such that their conversions are synchronized. Although, the use of two ADCs can increase complexity and possible noise, the use of digital signal processor 310 allows more robust signal conditioning to better approximate the input signal. For example, if the input signal is known to be or observed to be slowly varying, the perturbation estimate may be low pass filtered to reduce its noise contribution. In another example, the perturbation may be assumed to be statically correlated with observed input voltage (along with its observed derivatives or other time history) and used to correct on that basis (e.g., via a lookup table of correction vs. input voltage).

Figure 4:
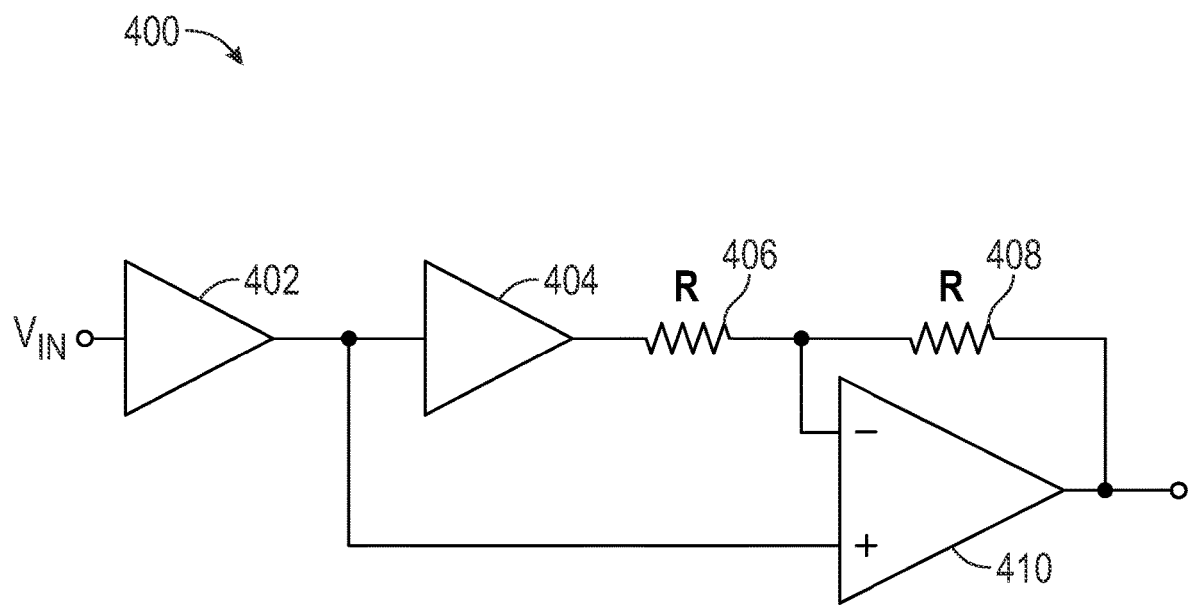
FIG. 4 illustrates a block diagram of example portions of a signal conditioning circuit.

FIG. 4 illustrates a block diagram of example portions of a signal conditioning circuit 400. The signal conditioning circuit 400 implements the signal processing functionality in the analog domain without ADCs. Th signal conditioning circuit 400 may include a first buffer 402, a second buffer 404, a first resistor R 406, a second resistor R 408, and an amplifier 410.

The first buffer 402 and second buffer 404 may operate in the same manner as buffers 102, 104 described above with reference to FIG. 1. The output of the first buffer 402 ($V_{B1}$) may be coupled to the positive terminal of the amplifier 410. The output of the second buffer 404 ($V_{B2}$) may be coupled to the negative terminal of the amplifier 410 with resistors 406, 408 functioning as a voltage divider. Thus, the amplifier 410 may generate the difference of the error components introduced by the buffers (e.g., $2V_{B1}-V_{B2}$ or $V_{B1}-0.5V_{B2}$).

In the examples described above, the error components of the buffers were estimated to be substantially similar (($V_{err1} \approx V_{err2}$). However, in some cases, this estimation may need to be adjusted. For example, the perturbation introduced by a buffer can be a function of the input voltage, and may be large enough that the input to the second buffer differs enough from the input voltage that the second buffer's perturbation differs substantially from the first buffer's. If that dependence function is a-priori well-known, it may be compensated for in the signal processing. Additional stages of cascaded buffers can be used to determine the instantaneous extent of the perturbation's dependence on the input voltage.

Figure 5:
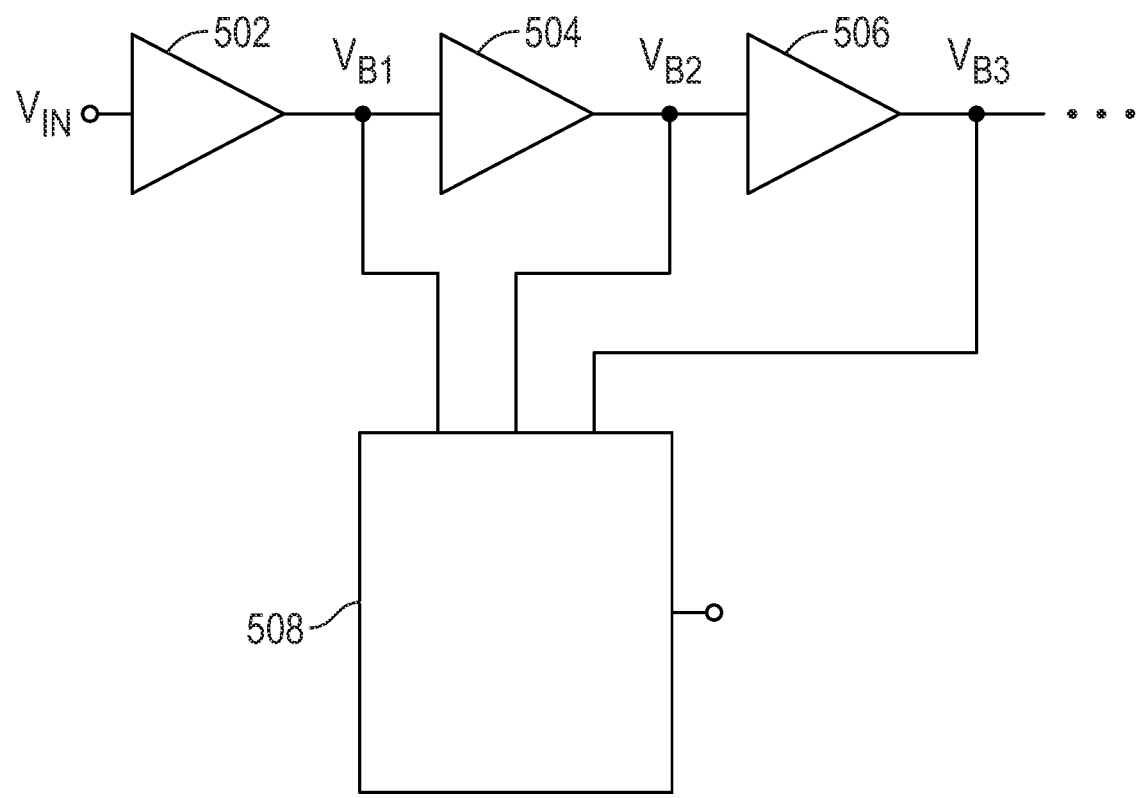
FIG. 5 illustrates a block diagram of example portions of a signal conditioning circuit.

FIG. 5 illustrates a block diagram of example portions of a signal conditioning circuit 500. The signal conditioning circuit 500 may include a first buffer 502, a second buffer 504, a third buffer 506, and a processing circuit 506. The signal conditioning circuit 500 includes three buffers and allows for estimation of the difference between error components introduced by the buffers. Hence, the processing circuit 500 may estimate the difference of the error components of the first and second buffers ($V_{err1}-V_{err2}$) and the difference of the error components of the second and third buffers ($V_{err2}-V_{err3}$). This additional information can be used for a quadratic estimate of the input signal rather than a linear estimate. The use of additional buffers may be useful especially in situations where errors are more stable and dependent on the input voltage. Three buffers are shown in FIG. 5 for illustration purposes, and more buffers (and more error terms) can be used.

Figure 6:
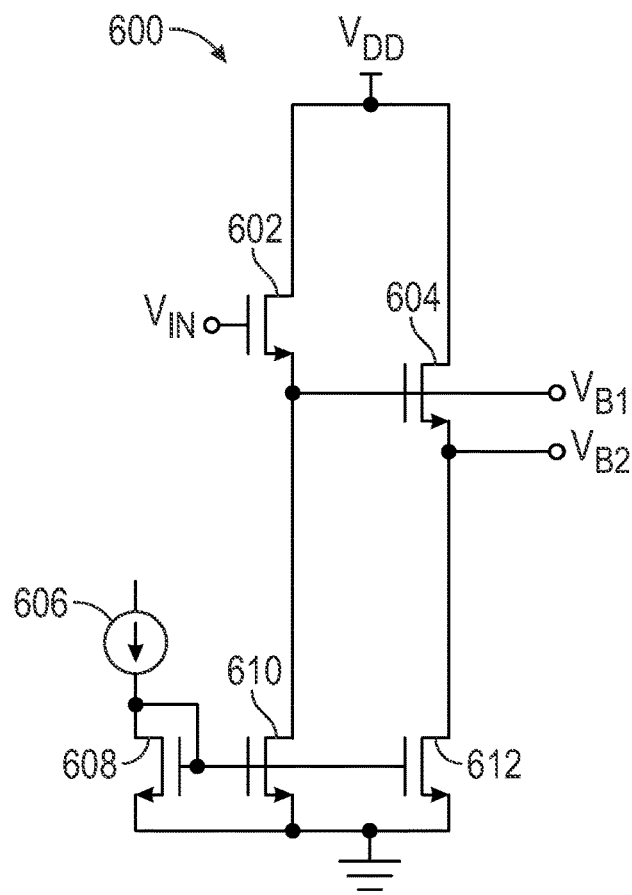
FIG. 6 illustrates a circuit diagram of example portions of a buffer circuit.

Different buffer circuits can be used with the techniques described herein. For example, the buffer circuits may be provided as source-follower transistor elements. FIG. 6 illustrates a circuit diagram of example portions of a buffer circuit 600. The buffer circuit 600 may include a first transistor 602, which can operate as a first buffer as described herein, and a second transistor 604, which can operate as a second buffer as described herein. In some examples, the first and second transistors 602, 604 may be provided as NMOS source-follower transistors. Other types of transistors may also be used. The gate of the first transistor 602 may be coupled to the input signal $V_{IN}$; the drain may be coupled to a positive supply $V_{DD}$; and the source may be coupled to transistor 610 functioning as a current source biased by transistor 608 and current source 606. The output of the first transistor 602 ($V_{B1}$) may be generated at its source node.

The output of the first transistor 602 ($V_{B1}$) may also be coupled to the gate of the second transistor 604. The drain of the second transistor 604 may be coupled the positive supply $V_{DD}$ and the source may be coupled to a transistor 612 functioning as a current source. The output of the second transistor 604 ($V_{B2}$) may be generated at its source node.

In FIG. 6, the first and second buffers are provided using a single source-follower transistors 602, 604. This simple implementation can be sufficient in most practical cases; however, it can be vulnerable to abrupt types of error. For example, the errors of the source-follower buffers can be related to the drain-to-source voltage effects on the source follower Vas and the current source ID. Due to a (likely) large Vas of the first buffer, the second buffer can experience substantially different operating drain-to-source voltages from the first buffer, and so its error may not match the first buffer's error well. This issue can be improved by matching the drain-to-source characteristics of the devices in the two buffers.

Figure 7:
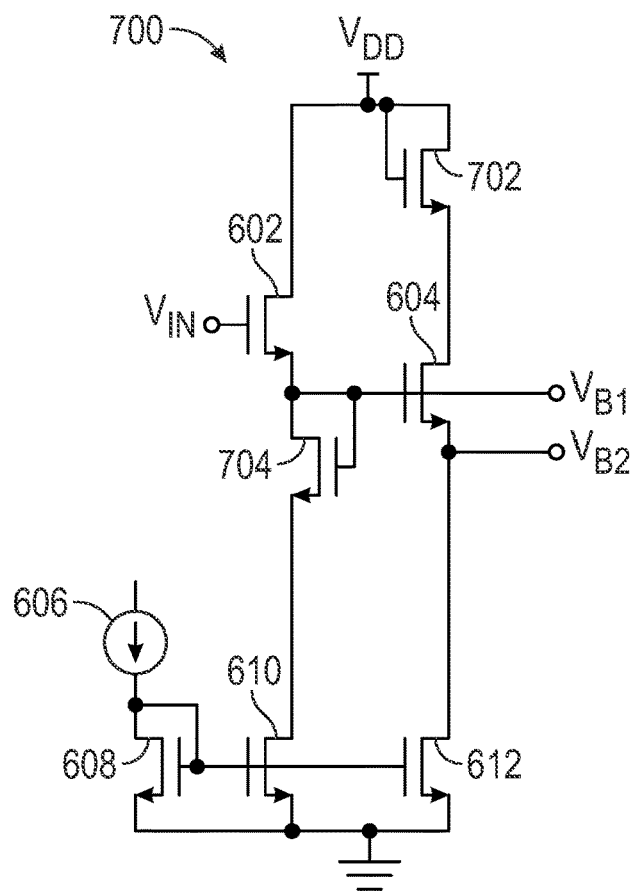
FIG. 7 illustrates a circuit diagram of example portions of a buffer circuit.

FIG. 7 illustrates a circuit diagram of example portions of a buffer circuit 700. The buffer circuit 700 adds two diode devices 702, 704 to the buffer circuit 600, as described above, to match the drain-to-source characteristic of the devices in the two buffers. For example, diode device 702 is added between the positive supply $V_{DD}$ and the second buffer transistor 604. The diode device 702 matches the gate-to-drain voltage of the second buffer transistor 604 to be substantially the same as the gate-to-drain voltage of the first buffer transistor 602.

The diode device 704 provides the same functionality for the current source transistors and is coupled between the first buffer transistor 602 and current source transistor 610. The diode devices 702, 704 may be implemented as NMOS devices or other similar devices.

As mentioned above, the distortion reducing techniques described herein can be used with a variety of ADC types or signal processing circuitry. For example, the techniques can be applied to a subranging ADC in a direct fashion as described in the examples above. Also, the distortion reducing techniques can also be integrated into the internal operations of signal processing circuitry, such as a subranging ADC.

Figure 8:
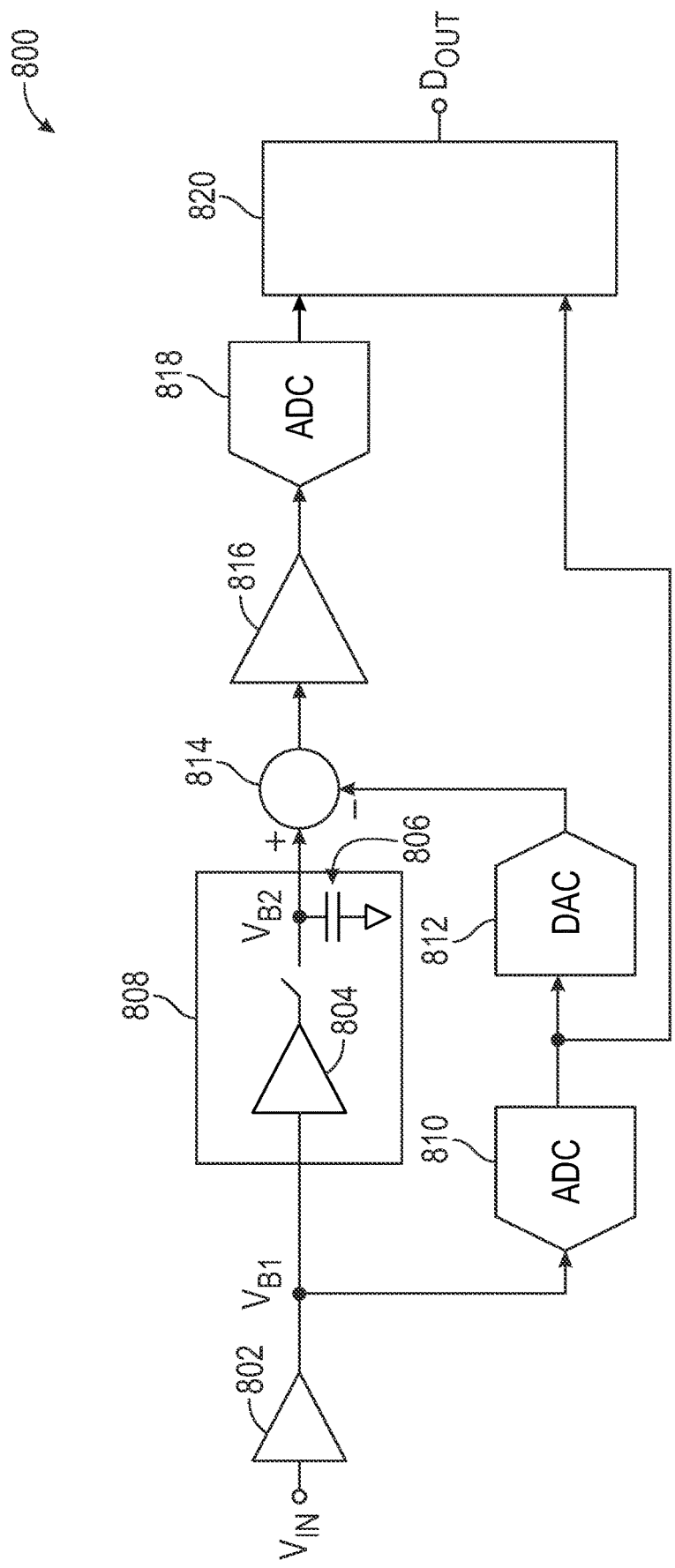
FIG. 8 illustrates a circuit diagram of example portions of a subranging analog-to-digital converter.

FIG. 8 illustrates a circuit diagram of example portions of a subranging ADC 800. The subranging ADC 800 may include a first buffer 802, a second buffer 804, a capacitor 806 (the second buffer 804 and capacitor 806 forming a delay circuit 808), an ADC 810, a DAC 812, a subtractor 814, an amplifier 816, an ADC 818, and a processing circuit 820. An input signal $V_{IN}$ may be provided to an input of the first buffer 802. The input signal is an analog signal and can be provided as an AC or DC signal. The first buffer 802 may buffer the input signal $V_{IN}$ and generate a first buffer output signal $V_{B1}$.

The output of the first buffer 802 may be coupled to the second buffer 804 and the ADC 810. The second buffer 804 may buffer $V_{B1}$ and generate a second buffer output signal $V_{B2}$, which is stored in capacitor 804 of the delay circuit 808.

A first digital estimate of $V_{B1}$ (and consequently $V_{IN}$) may be obtained from ADC 810, which can be a "coarse" estimate of low resolution or accuracy. The digital estimate is converted back to an analog signal by DAC 812, which is then subtracted from a "delayed" version of the input signal from delay circuit 808 to generate a "residue" estimate. The residue signal may be amplified by the amplifier 816 and converted to a digital signal by ADC 818, which is then inputted into the processing circuit 820. The processing circuit 820 can cancel the errors of ADC 810 to generate DOUT.

The delay circuit 808 may provide a continuous-time delay (e.g. in a continuous-time pipeline ADC) or a discrete time delay (e.g., a sample-and-hold). These delay functions can be combined. For example, a capacitive array in a discrete time pipeline may provide the sample-and-hold function of the delay circuit 808, the conversion function of DAC 812, and subtraction function of subtractor 814.

The buffer 802 may isolate the input terminal from disturbances due to ADC 810 and delay circuit 808. The buffer 802 may also provide sample-and-hold function, which can be leveraged for the design of ADC 810 and delay circuit 808. However, as discussed above, buffer 802 may also introduce some perturbation or distortion (i.e., error) to the input signal. This error may be suppressed using the circuit design discussed above (e.g., FIG. 2 and its description).

Moreover, the distortion reducing techniques can also be integrated into the architecture of the subranging ADC 800. The signal converted by ADC 810 ($V_{B1}$) can contain only the error of buffer 802, while the signal converted by ADC 818 (residue signal) can contain the error introduced by both buffers 802, 804 combined with a known signal provided by DAC 812. The processing circuit 820 may therefore calculate an estimate of the error introduced by buffer 804 and subtract the estimated error from the residue signal to suppress the errors introduced by buffer 802 (which is approximately the same as the error introduced by buffer 804).

The digital signal generated by ADC 810 can be of low resolution and potentially may include high noise; therefore, the digital signal may have insufficient accuracy to measure the comparatively small error introduced by buffer 804. However, to increase the resolution of the digital residue signal, dither and residue shaping techniques can be used, which allow the effective long-term-average accuracy of the ADC 810 to exceed its instantaneous resolution or noise. For example, dither and residue shaping can be performed using the techniques described in U.S. Pat. No. 8,810,443 entitled "Analog-To-Digital Converter System and Method," granted on Aug. 19, 2014, which is incorporated herein by reference in its entirety, the incorporation by reference being made with the following exception: In the event that any portion of the above-referenced patent is inconsistent with this application, this application supersedes the above-referenced patent. Furthermore, the results may be coherently averaged separately for differing regions of the input voltage span to store a table of corrections, which may be beneficial, for example, for higher-frequency input signals.

Figure 9:
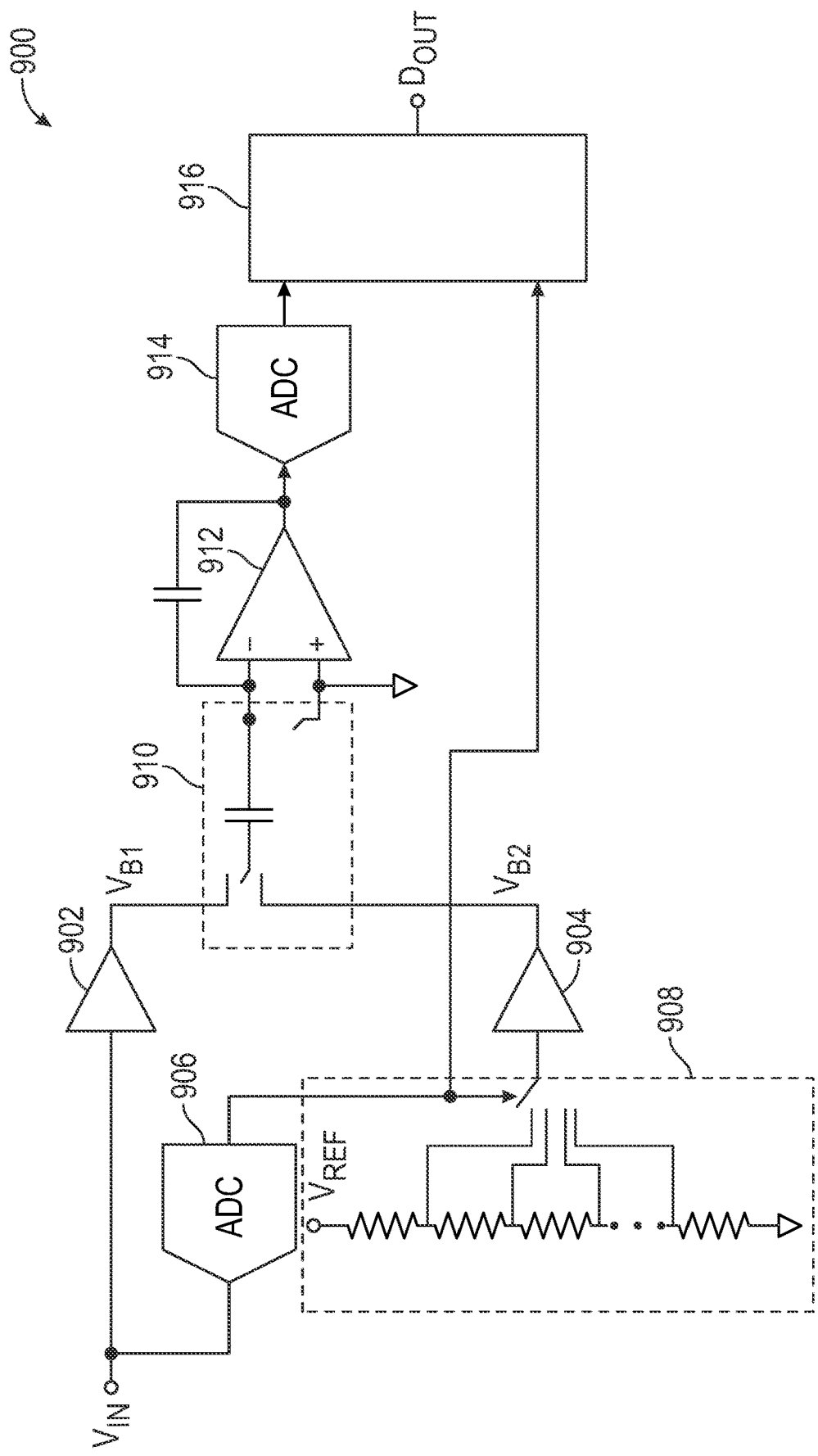
FIG. 9 illustrates a circuit diagram of example portions of a subranging analog-to-digital converter.

The second buffer can be provided in different locations of a subranging ADC, such as after the DAC. FIG. 9 illustrates a circuit diagram of example portions of a subranging ADC 900. The subranging ADC 900 may include a first buffer 902, a second buffer 904, an ADC 906, a DAC 908, a switched capacitor component 910, an amplifier 912, an ADC 914, and a processing circuit 916. An input signal $V_{IN}$ may be provided to an input of the first buffer 902. The input signal is an analog signal and can be provided as an AC or DC signal. The first buffer 902 may buffer the input signal $V_{IN}$ and generate a first buffer output signal $V_{B1}$. The output of the first buffer 902 may be coupled to the switched capacitor component 908.

The ADC 906 may be coupled to the input signal $V_{IN}$ or signal $V_{B1}$ at the output of buffer 902 to generate the "coarse" estimate of the input signal ($V_{IN}$), The digital estimate is converted back to an analog signal by DAC 908, which can be provided as a string DAC. The output of the DAC 908 may be coupled to the second buffer 904, which is coupled to the switched capacitor component 910. The switched capacitor component 910 may selectively switch between the output of the first buffer 902 and the output of the second buffer 904 as its input. The switched capacitor component 910 may selectively connect its input (either output of the first buffer 902 or output of the second buffer 904) to the amplifier 912. The output of the amplifier 912 (e.g., residue signal) may be converted to a digital signal by ADC 914, which is then inputted into the processing circuit 916, which generates Dour using the techniques described herein.

The switched capacitor component 910 may perform a combined sample-and-hold and subtraction function. The analog subtraction by the switched capacitor component 910 generates the residue signal, which is the difference of the input signal $V_{IN}$ and the coarse estimate at the output of DAC 908, plus the difference of the error introduced by the first buffer 902 and the error introduced by the second buffer 904. The operation of DAC 908 can produce a voltage which approximates the input voltage, and therefore the error of second buffer 904 will be similar to that of the first buffer 902, providing error cancellation. As mentioned above, application of dither or residue-shaping techniques may provide additional accuracy in the error approximation, improving the extent of error suppression.

Various Notes

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. A analog-to-digital converter (ADC) system with disturbance reduction, the ADC system comprising:
    a first buffer to receive an input signal and to generate a first buffer output signal;
    a second buffer to receive the first buffer output signal and to generate a second buffer output signal;
    a first ADC component to generate a first digital signal based on the first buffer output signal;
    a second ADC component to generate a second digital signal based on a difference of the second buffer output signal and the first output buffer signal; and
    a signal processing circuit to generate a corrected digital output signal based on the first digital signal and the second digital signal.

2. The ADC system of claim 1, wherein the first buffer introduces a first error component and the second buffer introduces a second error component, and
    wherein the signal processing circuit to execute a function to subtract the second error component from the second digital signal.

3. The ADC system of claim 1, wherein the signal processing circuit to performing dither or residue shaping.

4. The ADC system of claim 1, wherein the signal processing circuit to average different regions of a span of the input signal to generate a table of corrections.

5. The ADC system of claim 1, further comprising:
a digital-to-analog converter (DAC) component to convert the first digital signal to a converted buffer analog signal.

6. The ADC system of claim 5, further comprising:
a subtractor to generate the difference of the second buffer output signal and the first output buffer signal based on the second buffer output signal and the converted buffer analog signal.

7. The ADC system of claim 6, further comprising:
an amplifier to amplify the difference of the second buffer output signal and the first output buffer signal.

8. The ADC system of claim 1, wherein the second buffer is provided in a delay circuit.

9. The ADC system of claim 1, wherein the ADC system is a subranging ADC.

10. A analog-to-digital converter (ADC) apparatus with disturbance reduction, the ADC apparatus comprising:
a first buffer to receive an input signal and to generate a first buffer output signal;
a first ADC component to receive the first buffer output signal and to generate a first digital signal;
a digital-to-analog converter (DAC) component to generate a converted first buffer output signal based on the first digital signal;
a second buffer to receive the converted first buffer output signal and to generate a second buffer output signal;
a second ADC component to generate a second digital signal based on a difference of the second buffer output signal and the first output buffer signal; and
a signal processing circuit to generate a corrected digital output signal based on the first digital signal and the second digital signal.

11. The ADC apparatus of claim 10, wherein the first buffer introduces a first error component and the second buffer introduces a second error component, and wherein the signal processing circuit to execute a function to subtract the second error component from the second digital signal.

12. The ADC apparatus of claim 10, wherein the signal processing circuit to performing dither or residue shaping.

13. The ADC apparatus of claim 10, wherein the signal processing circuit to average different regions of a span of the input signal to generate a table of corrections.

14. The ADC apparatus of claim 10, further comprising:
a switched capacitor circuit to selectively couple the first buffer output signal and the second buffer output signal to an amplifier.

15. The ADC apparatus of claim 10, wherein the DAC includes a resistor string.

16. The ADC apparatus of claim 10, wherein the ADC apparatus is a subranging ADC.

17. A subranging analog-to-digital converter (ADC) system comprising:
a first buffer to receive an input signal and to generate a first buffer output signal, wherein the first buffer introduces a first error component;
a second buffer to generate a second buffer output signal, wherein the second buffer introduces a second error component;
a first ADC component to generate a coarse estimate of the input signal;
a second ADC component to generate a digital signal based on a difference of the second buffer output signal and the first output buffer signal; and
a signal processing circuit to subtract the second error component from the first error component to generate a corrected digital output signal based on the digital signal and the coarse estimate.

18. The subranging ADC system of claim 17, wherein the signal processing circuit to execute a function to subtract the second error component from the digital signal.

19. The subranging ADC system of claim 17, wherein the signal processing circuit to performing dither or residue shaping.

20. The subranging ADC system of claim 17, wherein the signal processing circuit to average different regions of a span of the input signal to generate a table of corrections.

* * * * *